United States Patent
Hwang et al.

(10) Patent No.: US 9,054,259 B2
(45) Date of Patent: Jun. 9, 2015

(54) LIGHT-EMITTING DEVICE AND METHOD OF MANUFACTURING THE SAME

(71) Applicant: SAMSUNG ELECTRONICS CO., LTD., Gyeonggi-do (KR)

(72) Inventors: Kyung-wook Hwang, Gyeonggi-do (KR); Cheol-Soo Sone, Seoul (KR); Geon-wook Yoo, Gyeonggi-do (KR); Dong-hoon Lee, Seoul (KR); Nam-goo Cha, Gyeonggi-do (KR); Jae-hyeok Heo, Jeju-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 22 days.

(21) Appl. No.: 13/844,782

(22) Filed: Mar. 15, 2013

(65) Prior Publication Data

US 2013/0313583 A1   Nov. 28, 2013

(30) Foreign Application Priority Data

May 22, 2012   (KR) .......................... 10-2012-0054444

(51) Int. Cl.
| | |
|---|---|
| H01L 33/00 | (2010.01) |
| H01L 33/08 | (2010.01) |
| H01L 33/42 | (2010.01) |
| H01L 33/46 | (2010.01) |
| H01L 33/24 | (2010.01) |
| H01L 33/40 | (2010.01) |

(52) U.S. Cl.
CPC ................. *H01L 33/08* (2013.01); *H01L 33/24* (2013.01); *H01L 33/405* (2013.01); *H01L 33/42* (2013.01); *H01L 33/46* (2013.01)

(58) Field of Classification Search
CPC ......... H01L 33/00; H01L 33/38; H01L 33/46; H01L 29/0665; H01L 29/0676
USPC ...................................... 257/79, 96
See application file for complete search history.

(56) References Cited

U.S. PATENT DOCUMENTS

| | | | | |
|---|---|---|---|---|
| 5,905,275 | A | * | 5/1999 | Nunoue et al. .................. 257/95 |
| 7,558,307 | B2 | * | 7/2009 | Kishimoto et al. ........ 372/46.01 |
| 2009/0146142 | A1 | | 6/2009 | Kim et al. |
| 2010/0283064 | A1 | * | 11/2010 | Samuelson et al. ............. 257/88 |
| 2011/0254034 | A1 | * | 10/2011 | Konsek et al. .................. 257/98 |

FOREIGN PATENT DOCUMENTS

| | | |
|---|---|---|
| KR | 20080030042 A | 4/2008 |
| KR | 2011-0040676 A | 4/2011 |
| KR | 2011-0054318 A | 5/2011 |

* cited by examiner

*Primary Examiner* — David Vu
*Assistant Examiner* — Brandon Fox
(74) *Attorney, Agent, or Firm* — McDermott Will & Emery LLP

(57) ABSTRACT

The present application relates to a light-emitting device and method of manufacturing the same. The device includes a lower portion, and vertical light-emitting structures disposed on the lower portion. A conductive member partially surrounds the vertical light-emitting structures, and reflective members are disposed between the vertical light-emitting structures. The reflective members reflect light that is emitted in a lateral direction from the vertical light-emitting structures to minimize the number of times that light emitted in a lateral direction from the vertical light-emitting structure is transmitted through the light-absorbing member, thereby increasing a luminous efficiency.

12 Claims, 8 Drawing Sheets

LIGHT-EMITTING DEVICE AND METHOD OF MANUFACTURING THE SAME

CROSS-REFERENCE TO RELATED APPLICATIONS

This application claims the benefit to Korean Patent Application No. 10-2012-0054444, filed on May 22, 2012, in the Korean Intellectual Property Office, the disclosure of which is incorporated herein in its entirety by reference.

TECHNICAL FIELD

The present disclosure relates to light-emitting devices and methods of manufacturing the same.

BACKGROUND

A semiconductor light-emitting device such as a light-emitting diode (LED) or a laser diode (LD) uses an electroluminescence phenomenon whereby light is emitted from a material (semiconductor) by supplying current or applying voltage. While electrons and holes are combined with each other in an active layer (for example, an emissive layer) of the semiconductor light-emitting device, energy corresponding to an energy band gap of the active layer may be emitted in the form of light. Thus, according to the size of the band gap of the active layer, a wavelength of the light emitted from the semiconductor light-emitting device may vary.

A semiconductor light-emitting device may be classified into a two-dimensional (2D) light-emitting device (which is a thin film-type light-emitting device) including a 2D active layer and a three-dimensional (3D) light-emitting device including a 3D active layer.

In a light-emitting device including a 3D light-emitting device, for example, a plurality of nanorod structures, an active layer is formed in a 3D form. Compared with a 2D light-emitting device, the 3D light-emitting device may have an increased light-emitting area to increase a luminous efficiency. In addition, it is relatively easy to freely select colors that are realized by the 3D light-emitting device.

However, although a light-emitting area of a 3D light-emitting device is increased, a luminous efficiency is not increased by as much as the increase in the light-emitting area. Since light that is emitted upward or downward in a 3D light-emitting device is transmitted through a relatively short optical path of a light-absorbing member, such as a transparent electrode, light absorption is relatively low. However, since light that is emitted in a lateral direction, is transmitted through a very long optical path, light absorption is relatively high.

Accordingly, there exists a need for further improvements in light-emitting devices which minimize the number of times that light is transmitted through a light-absorbing member in order to increase luminous efficiency of the device.

SUMMARY

The inventive concept provides a light-emitting device for minimizing the amount of light absorbed by a light-absorbing member such as a transparent electrode from light emitted in a lateral direction, and a method of manufacturing the light-emitting device.

Additional aspects will be set forth in part in the description which follows and, in part, will be apparent from the description, or may be learned by practice of the presented examples.

According to an aspect of the present application, there is provided a light-emitting device. The device includes a lower layer, and vertical light-emitting structures disposed on the lower layer. A conductive member partially surrounds the vertical light-emitting structures. Reflective members are disposed between the vertical light-emitting structures and reflect light that is emitted in a lateral direction of the f vertical light-emitting structures.

Each of the vertical light-emitting structures may have a core-shell structure.

Each of the vertical light-emitting structures may include a first conductive type semiconductor, an active layer, and a second conductive type semiconductor. The first conductive type semiconductor may be a core portion, and the active layer and the second conductive type semiconductor may be a shell portion.

Each of the vertical light-emitting structures may have any one of the following shapes: nanorod, nanowire, or nanopyramid.

The conductive member may include any one of indium tin oxide (ITO), ZnO, IZO(ZnO:In), AZO(ZnO:Al), GZO(ZnO:Ga), $In_2O_3$, $SnO_2$, CdO, $CdSnO_4$, and $Ga_2O_3$.

A refractive index of each of the reflective members may be smaller than a refractive index of the conductive member.

The reflective members may each have a nanobead shape.

Each of the reflective members may include an internal portion and an external portion that have different refractive indexes.

A refractive index of the internal portion of each of the reflective members may be smaller than a refractive index of the external portion.

The reflective members may have the same diameter.

The reflective members may have two or more diameters.

The light-emitting device may further include a mask layer disposed on the lower layer and has holes that expose the lower layer therethrough. The vertical light-emitting structures may be disposed on portions of the lower layer, which are exposed by the holes.

The lower layer may include a substrate and a semiconductor layer disposed on the substrate, and the vertical light-emitting structures may be disposed on the semiconductor layer.

According to another aspect of the present application, there is provided a method of manufacturing a light-emitting device. The method includes the steps of forming a mask layer on a lower layer and patterning to form holes to expose the lower layer therethrough. A vertical light-emitting structure is formed by forming a first conductive type semiconductor on portions of the lower layer, which are exposed by the holes. Next, an active layer is formed surrounding the first conductive type semiconductor and a second conductive type semiconductor. A light-absorbing member is formed that at least partially surrounds the vertical light-emitting structure and reflective members that reflect light that is emitted in a lateral direction of the vertical light-emitting structure.

A light-emitting device according to the present application reflects light emitted in a lateral direction of a perpendicular light-emitting device via a reflective member. Thus, the number of times that light is transmitted through the light-absorbing member may be minimized, thereby increasing luminous efficiency. In yet another aspect, a light-emitting device is provided. The device includes a semiconductor layer and vertical light-emitting structures disposed on and extending in a direction substantially perpendicular to the semiconductor layer. A light absorbing member is disposed on the semiconductor layer and surrounds at least a portion of the vertical light-emitting structures. Reflective members are disposed between the vertical light-emitting structures and reflect light that is emitted from the vertical light-emitting structures.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The drawing figures depict one or more implementations in accord with the present teachings, by way of example only, not by way of limitation. In the figures, like reference numerals refer to the same or similar elements.

DETAILED DESCRIPTION

Figure 1:
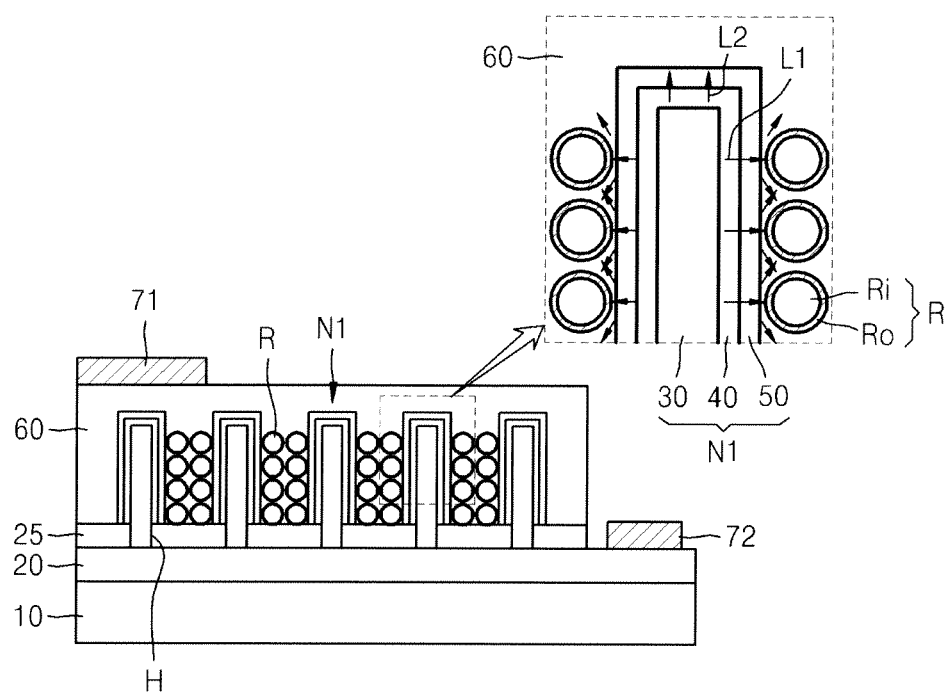
FIG. 1 is a cross-sectional view of a light-emitting device according to an example of the inventive concept.
Figure 2:
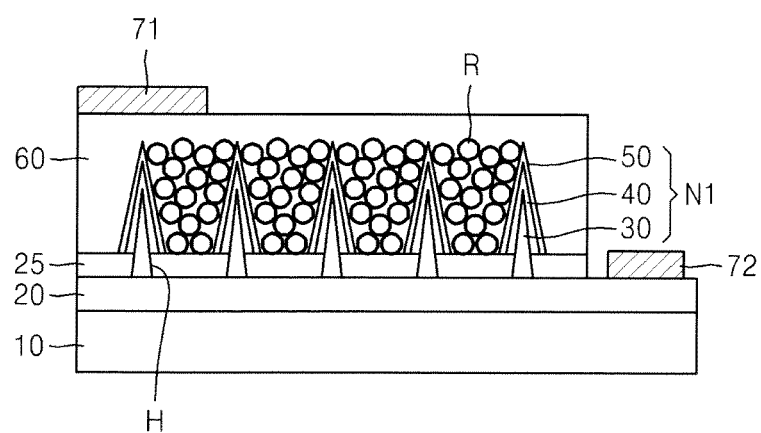
FIG. 2 is a cross-sectional view of a light-emitting device according to another example of the inventive concept.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

Hereinafter, a light-emitting device and a method of manufacturing the same will be described with regard to exemplary examples of the inventive concept with reference to the attached drawings. In the drawings, the thicknesses of layers and regions are exaggerated for clarity. Like reference numerals in the drawings denote like elements, and thus their description will be omitted. As used herein, the term "and/or" includes any and all combinations of one or more of the associated listed items. Expressions such as "at least one of," when preceding a list of elements, modify the entire list of elements and do not modify the individual elements of the list.

FIG. 1 is a cross-sectional view of a light-emitting device according to an example of the inventive concept.

Referring to FIG. 1, a first conductive type semiconductor layer 20 (hereinafter, referred to as a semiconductor layer 20) may be disposed on a substrate 10. The substrate 10 may be any one substrate from among various substrates that are used in a general semiconductor device. For example, the substrate 10 may be any one from among a sapphire ($Al_2O_3$) substrate, a Si substrate, a SiC substrate, an AlN substrate, and a Si—Al substrate. However, other substrates may be used as the substrate 10. The semiconductor layer 20 may be, for example, an n-type semiconductor layer, or alternatively, may be a p-type semiconductor layer if necessary. The semiconductor layer 20 may have a single-layer structure or a multilayer structure. A mask layer 25 may be disposed on a predetermined region of the semiconductor layer 20. A plurality of holes H that expose the semiconductor layer 20 therethrough may be formed in the mask layer 25. The mask layer 25 may be formed of a predetermined insulating material, for example, silicon nitride.

A plurality of vertical light-emitting structures N1 may be disposed on the mask layer 25. The vertical light-emitting structures N1 may each have, but are not limited to, a nanorod shape, or a nanowire, as shown in FIG. 1. Alternatively, the vertical light-emitting structures N1 may each have a nanopyramid shape.

In FIG. 1, the vertical light-emitting structures N1 may be formed to correspond to the holes H, respectively. In this case, the vertical light-emitting structures N1 may be connected to the semiconductor layer 20 through the holes H, respectively. The vertical light-emitting structures N1 may each include a first conductive type semiconductor 30 having a nanorod shape, an active layer 40 surrounding the first conductive type semiconductor 30, and a second conductive type semiconductor 50. The first conductive type semiconductor 30 may correspond to a core portion. The active layer 40 and the second conductive type semiconductor 50 may collectively correspond to a shell portion. That is, the vertical light-emitting structures N1 may each have a core-shell structure.

The first conductive type semiconductor 30 may be an n-type semiconductor and the second conductive type semiconductor 50 may be a p-type semiconductor, or vice versa. The active layer 40 may be an "emissive layer" emitting light when electrons and holes are combined with each other. The first conductive type semiconductor 30, the active layer 40, and the second conductive type semiconductor 50 may have various modified structures. For example, the first conductive type semiconductor 30, the active layer 40, and the second conductive type semiconductor 50 may have at least one multilayer structure. The active layer 40 may have a structure that is obtained by alternately stacking a quantum well layer and a barrier layer once or more. In this case, the quantum well layer may have a single quantum well structure or a multi-quantum well structure. Although not shown, a stack structure including the semiconductor layer 20, the first conductive type semiconductor 30, the active layer 40, and the second conductive type semiconductor 50 may further include a superlattice structure layer. Although not shown, the active layer 40 may be disposed on portions of the mask layer 25 between first conductive type semiconductors 30. That is, the active layer 40 may be formed to cover an entire upper surface of the mask layer 25. The second conductive type semiconductor 50 may also be formed to cover an entire upper surface of the mask layer 25. Alternatively, other modified structures may be used.

The light-emitting device according to the present example may include a light-absorbing member 60 surrounding the vertical light-emitting structures N1. The light-absorbing member 60 that absorbs light emitted from the vertical light-emitting structures N1 may be a conductive member having electrical conductivity. The conductive member may make a current smoothly supplied to the vertical light-emitting structures N1 that are spaced apart from each other. In this case, the conductive member may be formed of a transparent conductive material. The transparent conductive material may be any one of indium tin oxide (ITO), ZnO, IZO(ZnO:In), AZO (ZnO:Al), GZO(ZnO:Ga), $In_2O_3$, $SnO_2$, CdO, $CdSnO_4$, and $Ga_2O_3$.

Figure 3:
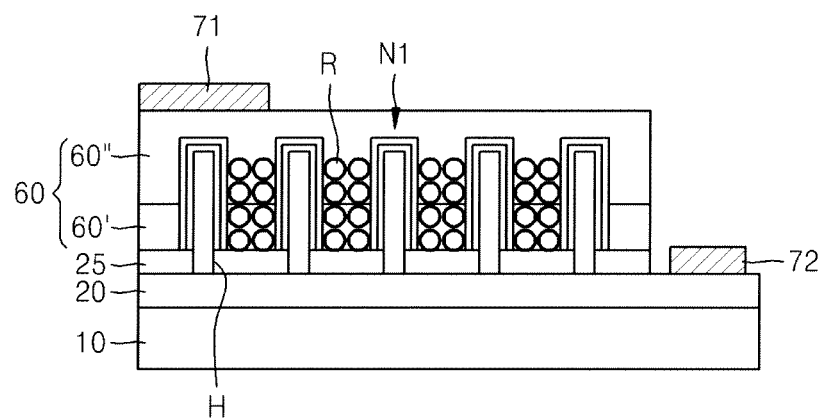
FIG. 3 is a cross-sectional view of a light-absorbing member according to another example of the inventive concept.

In FIG. 1, the light-absorbing member 60 is, but is not limited to, a conductive member overall. For example, as shown in FIG. 3, the light-absorbing member 60 may include a plurality of layers 60' and 60", as shown in FIG. 3. The lower layer 60' may be a protective layer and/or an insulating layer that are/is formed on the mask layer 25 and the upper layer 60" may be conductive member. Since an insulating layer is disposed at a lower portion, leakage current of the vertical light-emitting structures N1 may be prevented.

A first electrode 71 may be disposed on the light-absorbing member 60. The first electrode 71 may be formed of metal. The first electrode 71 may be electrically connected to the second conductive type semiconductor 50 through the light-absorbing member 60.

A second electrode 72 may be disposed on a region of the semiconductor layer 20, which is not covered by the mask layer 25. The second electrode 72 may be electrically connected to the first conductive type semiconductor 30 through the semiconductor layer 20. A predetermined electrical signal may be applied to the vertical light-emitting structures N1 through the first electrode 71 and the second electrode 72. As a result, predetermined light may be emitted from the vertical light-emitting structures N1.

A passivation layer (not shown) may be further disposed to cover portions of the semiconductor layer 20, the mask layer 25, and the light-absorbing member 60, which are not covered by the first electrode 71 and the second electrode 72. The passivation layer may protect the semiconductor layer 20, the mask layer 25, and the light-absorbing member 60 from an external environment. The passivation layer may be formed of an insulating material such as silicon oxide.

Figure 4A:
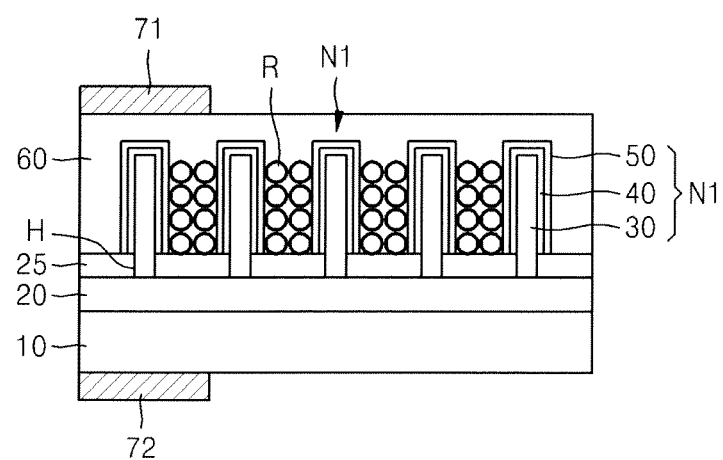
FIGS. 4a and 4b are cross-sectional views of light-emitting devices according to other embodiments of the inventive concept that shows other examples of arrangements of electrodes.

FIG. 1 shows a case where the second electrode 72 is disposed above the substrate 10. Alternatively, as shown in FIG. 4, the second electrode 72 may be disposed on a lower surface of the substrate 10. In FIG. 4A, the substrate 10 may be a semiconductor substrate. In this case, the second electrode 72 may be connected to the first conductive type semiconductor 30 through the substrate 10 and the semiconductor layer 20. In FIG. 4A, the semiconductor layer 20, the mask layer 25, the vertical light-emitting structures N1, the light-absorbing member 60, and so on may extend to cover an entire surface of the substrate 10.

Figure 4B:
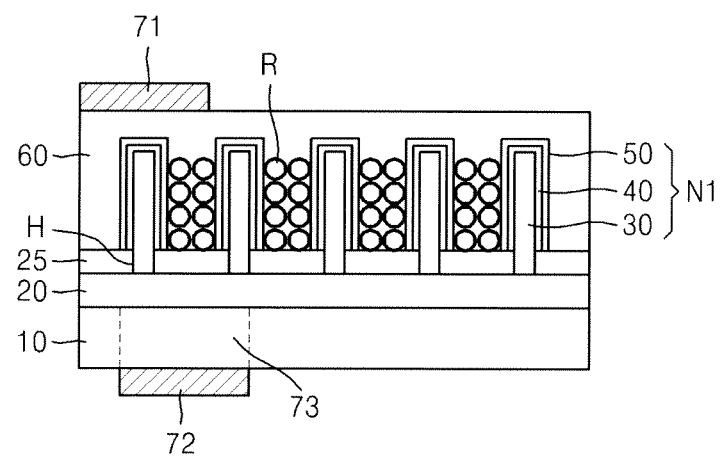

As shown in FIG. 4B, the second electrode 72 is disposed on the lower surface of the substrate 10, a conductive plug 73 may be formed in the substrate 10. The second electrode 72 and the semiconductor layer 20 may be connected to each other via the conductive plug 73. In this case, the substrate 10 may be an insulating substrate. As another example in FIG. 4A, the substrate 10 may be removed and the second electrode 72 may be disposed directly on a lower surface of the semiconductor layer 20.

A plurality of reflective members R may be disposed between the vertical light-emitting structures N1. The reflective members R may be disposed on lateral surfaces of the vertical light-emitting structures N1 and may reflect light L1 that is emitted from the vertical light-emitting structures N1 in a lateral direction so as to be directed upward or downward. In this case, the light L1 emitted in the lateral direction L1 is light that is emitted in a direction that crosses a direction perpendicular to the substrate 10 or the semiconductor layer 20 and is different from light L2 emitted in a direction perpendicular to the substrate 10.

Figure 5A:
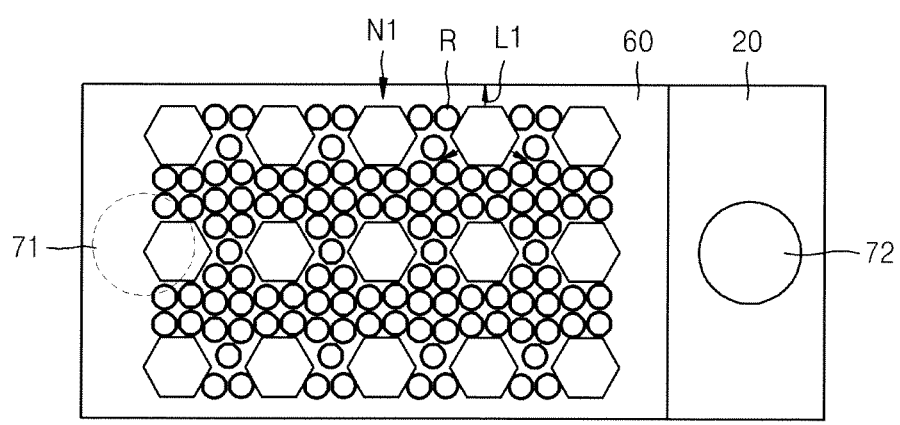
FIGS. 5A and 5B are plan views of the light-emitting device of FIG. 1, according to examples of the inventive concept.
Figure 5B:
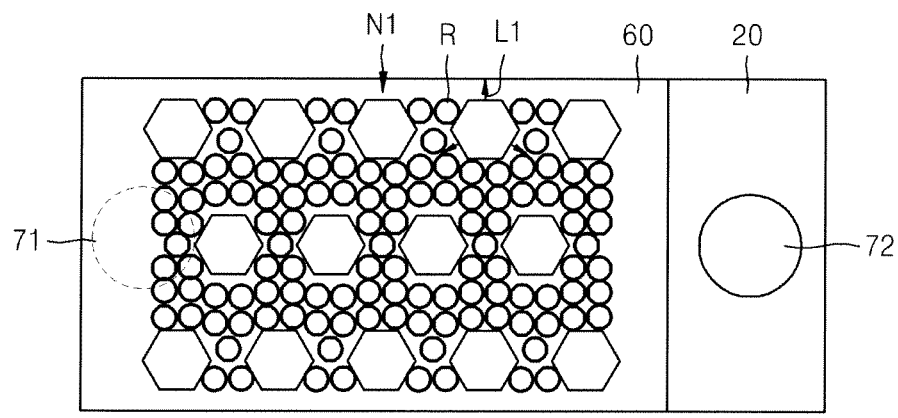

FIG. 5A is a plan view of a light-emitting device according to an example of the inventive concept. FIG. 5A shows a case where the reflective members R are disposed between the vertical light-emitting structures N1. However, when the reflective members R are not disposed between the vertical light-emitting structures N1, the light L1 emitted in the lateral direction may continuously proceed in the lateral direction. While the light L1 proceeds in the lateral direction, the light L1 may be transmitted through the light-absorbing member 60 such as a conductive member, or other vertical light-emitting structures N1. During this process, an undesirable amount of the light L1 may be absorbed by the absorbing member 60. Thus, even if the light L1 emitted in the lateral direction is reflected upward or downward, a luminous efficiency is remarkably reduced. However, when the reflective members R are used according to the inventive concept, since the light L1 emitted in the lateral direction is reflected off the reflective members R, the number of times that the light L1 is transmitted through the light-absorbing member 60, or other vertical light-emitting structures N1, may be minimized and thereby increase a luminous efficiency. The vertical light-emitting structures N1 may be linearly arranged as shown in FIG. 5A, but the inventive concept is not limited thereto. Alternatively, as shown in FIG. 5B, the vertical light-emitting structures N1 may be disposed in a zigzag pattern.

The reflective member R, with a nano structure, has a smaller refractive index than the light-absorbing member 60. Since the refractive index of the reflective member R is smaller than the refractive index of the light-absorbing member 60, light emitted through the light-absorbing member 60 may be reflected off the reflective member R rather than be transmitted through the reflective member R. For example, when the light-absorbing member 60 is formed of indium tin oxide (ITO), having a refractive index of about 1.8, the refractive index of the reflective member R may be smaller than 1.8.

The reflective member R may have a nanobead shape. Since the reflective member R has a nanobead shape, light that is emitted at various angles may be effectively reflected.

Figure 6:
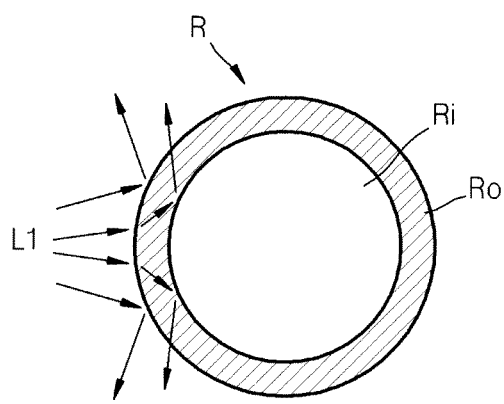
FIG. 6 is an enlarged cross-sectional view of a reflective member of a light-emitting device according to an example of the inventive concept.

In the reflective member R, an internal portion Ri and an external portion Ro may have different refractive indexes, as shown in FIG. 6. For example, the refractive index of the internal portion Ri may be smaller than the external portion Ro. Thus, even if light is not reflected off a surface of the external portion Ro of the reflective member R, since the light is reflected off an interface between the external portion Ro and the internal portion Ri, reflective efficiency may be increased. For example, the reflective member R may have a bead shape and the internal portion Ri may be hollow. In this case, the refractive index of the internal portion Ri may be 1.0 and the refractive index of the external portion Ro may be 1.5.

The reflective members R may have the same diameter, as shown in FIG. 1. That is, diameters of the reflective members R may be the same.

Figure 7:
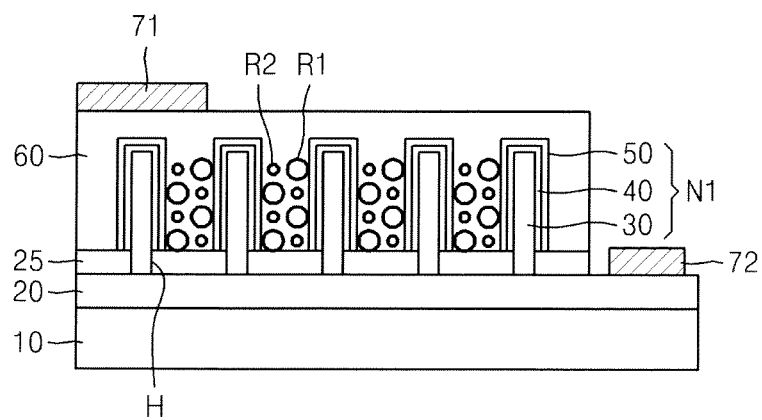
FIG. 7 is a cross-sectional view of a light-emitting device according to another example of the inventive concept.

As another example, the reflective members R may have two or more diameters. For example, the light-emitting device according to the present example may include a plurality of reflective members R1 and R2 having different diameters, as shown in FIG. 7.

In the above-described examples of the inventive concept, the light L1 emitted in the lateral direction may be reflected upward or downward, thereby increasing the luminous efficiency of a three-dimensional (3D) light-emitting device.

FIGS. 8A through 8E are cross-sectional views of a method of manufacturing a light-emitting device, according to an example of the inventive concept.

Figure 8A:
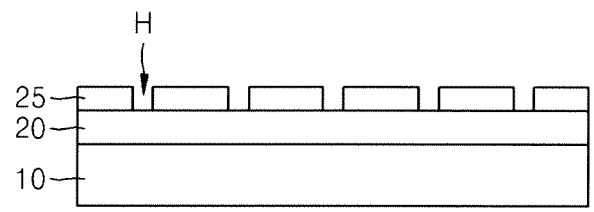
FIGS. 8A through 8E are cross-sectional views of a method of manufacturing a light-emitting device, according to an example of the inventive concept.

Referring to FIG. 8A, a first conductive type semiconductor layer 20 (hereinafter, referred to as a semiconductor layer 20) and an insulating layer 25 for a mask may be sequentially formed on the substrate 10. The semiconductor layer 20 may be an n-type semiconductor layer, or alternatively, may be a p-type semiconductor layer if necessary. The insulating layer for a mask may be formed of a predetermined insulating material, for example, silicon nitride or the like. A plurality of holes H that expose the semiconductor layer 20 therethrough may be formed by patterning the insulating layer for a mask. Hereinafter, the insulating layer for a mask, which is patterned to have the holes H, will be referred to as a "mask layer 25".

Figure 8B:
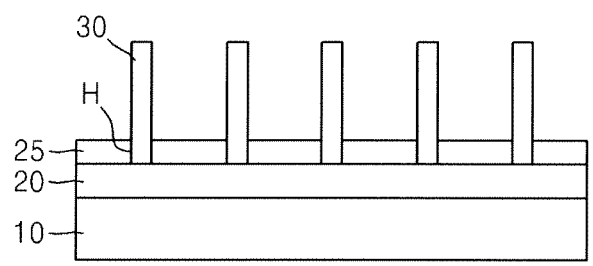

Referring to FIG. 8B, first conductive type semiconductors 30 having a nanorod or nanowire shape may be formed on portions of the semiconductor layer 20, which are exposed through the holes H. The first conductive type semiconductors 30 may be formed by using, for example, an epitaxial growing method. However, the shape of the first conductive type semiconductors 30 is not limited to the above-described shapes. For example, the first conductive type semiconductors 30 may have a nanopyramid shape.

Figure 8C:
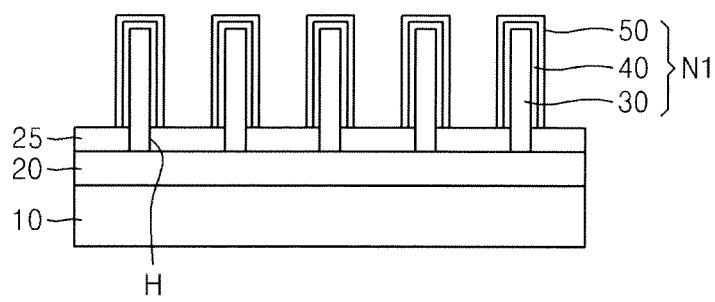

Referring to FIG. 8C, the active layer 40 and the second conductive type semiconductor 50, which surround the first conductive type semiconductors 30, may be sequentially formed in this order.

The first conductive type semiconductor 30, the active layer 40, and the second conductive type semiconductor 50 may constitute the vertical light-emitting structure N1 having a core-shell structure. The first conductive type semiconductor 30 may be an n-type semiconductor and the second conductive type semiconductor 50 may be a p-type semiconductor, or vice versa. The active layer 40 may be an "emissive layer" emitting light when electrons and holes are combined with each other. If necessary, the active layer 40 and the second conductive type semiconductor 50 may also be formed on the mask layer 25 between the vertical light-emitting structures N1.

Figure 8D:
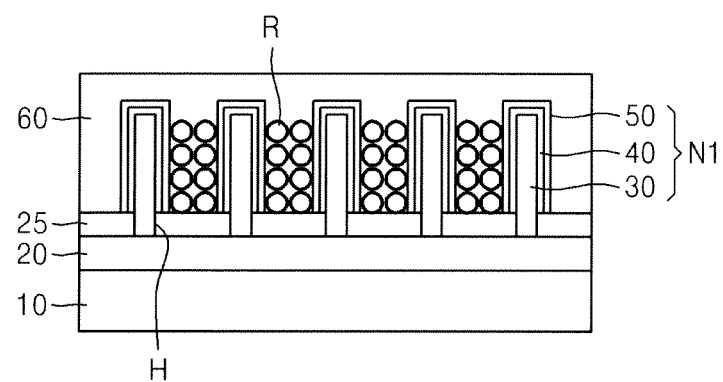

Referring to FIG. 8D, the light-absorbing member 60 and the reflective members R having a nanostructure may be formed between the vertical light-emitting structures N1.

The light-absorbing member 60 may be a conductive member that electrically contacts the second conductive type semiconductor 50. The conductive member may be formed of any one of, for example, ITO, IZO, ZnO, AZO, GZO(ZnO:Ga), $In_2O_3$, $SnO_2$, CdO, $CdSnO_4$, and $Ga_2O_3$.

The reflective member R having a nanostructure may have a smaller refractive index than the light-absorbing member 60. For example, when the light-absorbing member 60 is formed of ITO having a refractive index of about 1.8, the refractive index of the reflective member R may be smaller than 1.8.

Alternatively, the reflective member R may have a nanobead shape.

In the reflective member R, an internal portion Ri and an external portion Ro may have different refractive indexes, as shown in FIG. 6. For example, the refractive index of the internal portion Ri may be smaller than that of the external portion Ro. As an example, the reflective member R may have a hollow nanobead shape and the internal portion Ri may be hollow. In this case, the refractive index of the internal portion Ri may be 1.0 and the refractive index of the external portion Ro may be 1.5.

The reflective members R may have the same diameter or two or more diameters.

Figure 8E:
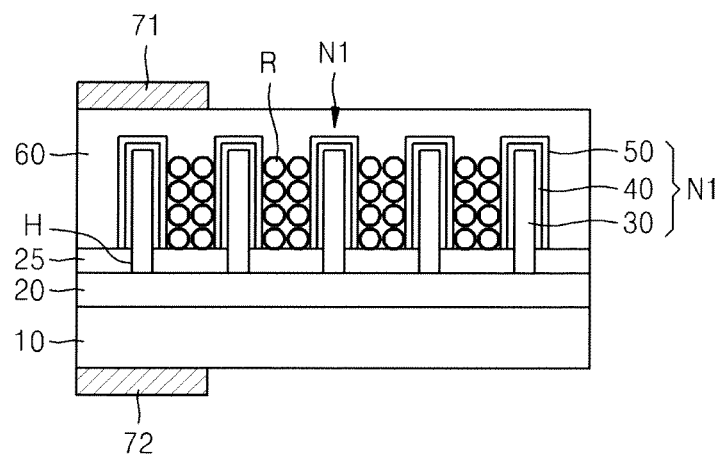

Referring to FIG. 8E, the first electrode 71 may be formed on the light-absorbing member 60 and the second electrode 72 may be formed below the substrate 10. The first and second electrodes 71 and 72 may be formed of a predetermined metal. The first and second electrodes 71 and 72 may be formed of the same material or different materials.

FIGS. 8A through 8E are diagrams illustrating a method of manufacturing the light-emitting device shown in FIGS. 4A and 4B. The light-emitting device shown in FIG. 1 may be manufactured by a method obtained by modifying the method described with reference to FIGS. 8A through 8E. That is, in the process described with reference to FIG. 8E, a light absorption member and so on, which are disposed on the semiconductor layer 20, may be removed to expose a portion of the semiconductor layer 20. Then, the first electrode 71 may be formed on the light-absorbing member 60 and the second electrode 72 may be formed on exposed portions of the semiconductor layer 20. In addition, a predetermined conductive plug may be formed in the substrate 10 and then the second electrode 72 may be formed on a lower surface of the substrate 10 to contact the conductive plug.

Hereinafter, one or more examples of the inventive concept will be described in detail with reference to the following Examples. However, these Examples are not intended to limit the purpose and scope of the one or more examples of the inventive concept.

EXAMPLE 1

As an example of a light-emitting device, as in FIG. 1, reflective members R that each have a hollow internal portion and have the same diameter were arranged between the vertical light-emitting structures N1, and the light-absorbing member 60 formed of $SiO_2$ having a refractive index of 1.5 was used between the reflective members R.

EXAMPLE 2

As another example of a light-emitting device, as in FIG. 7, a plurality of reflective members R1 and R2 that each have a hollow internal portion and have different diameters were arranged between the vertical light-emitting structures N1, and the light-absorbing member 60 formed of $SiO_2$ having a refractive index of 1.5 was used between the reflective members R1 and R2.

COMPARATIVE EXAMPLE 1

As a comparative example, air having a refractive index of 1.0 was filled between the vertical light-emitting structures N1.

COMPARATIVE EXAMPLE 2

As another comparative example, $SiO_2$ having a refractive index of 1.5 was filled as the light-absorbing member 60 between the vertical light-emitting structures N1.

Experimental Condition

Power was supplied to any one of the vertical light-emitting structures N1 and detectors were installed at five points at intervals of 2.5 μm in a circumferential direction from the vertical light-emitting structure N1 to which power was supplied. In this case, an optical amount was measured.

Figure 9:
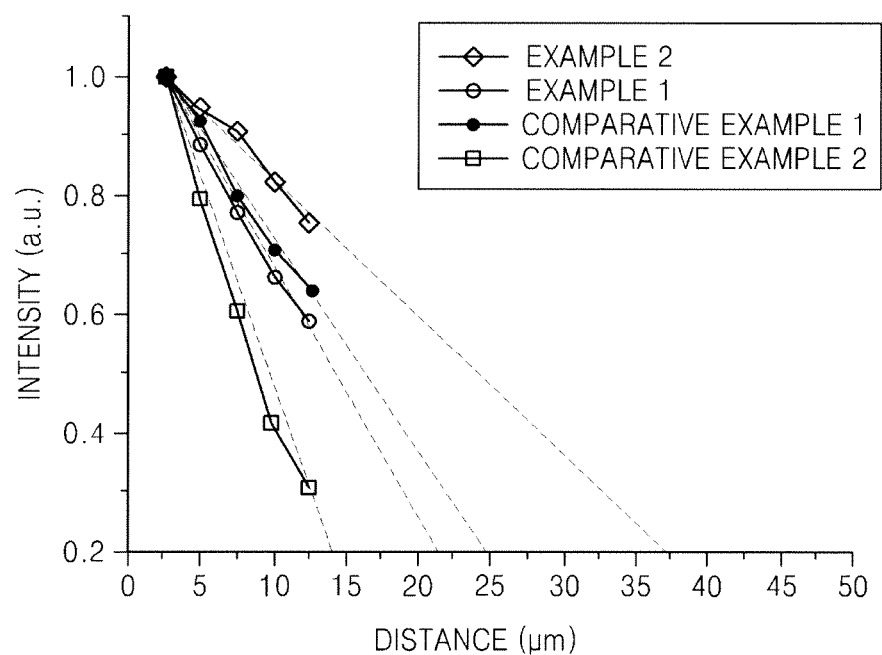
FIG. 9 is a graph showing a result of measuring an optical amount in Comparative Examples 1 and 2 and Examples 1 and 2.

FIG. 9 is a graph showing a result of measuring an optical amount in Comparative Examples 1 and 2 and Examples 1 and 2.

Referring to FIG. 9, in Comparative Examples 1 and 2, since any reflective member R for reflecting the light L1 emitted in the lateral direction is not formed between the vertical light-emitting structures N1, the light L1 that moved in the lateral direction reaches about 37.5 μm and 25 μm from a reference point (a start point of emission of light) rather than being reflected upward or downward. On the other hand, in Examples 1 and 2, since the reflective members R, which reflect the light L1 in the lateral direction and have a bead shape, are disposed between the vertical light-emitting structures N1 and the light L1 emitted in the lateral direction is reflected upward or downward, the light L1 that continuously proceeds in the lateral direction reaches about 14 μm and 21 μm from a reference point.

Thus, it is confirmed that the light L1 emitted in the lateral direction is relatively quickly reflected upward or downward in Comparative Examples 1 and 2 and Examples 1 and 2. That is, the number of times that the light L1 is transmitted through the light-absorbing member 60 may be minimized.

Figure 10A:
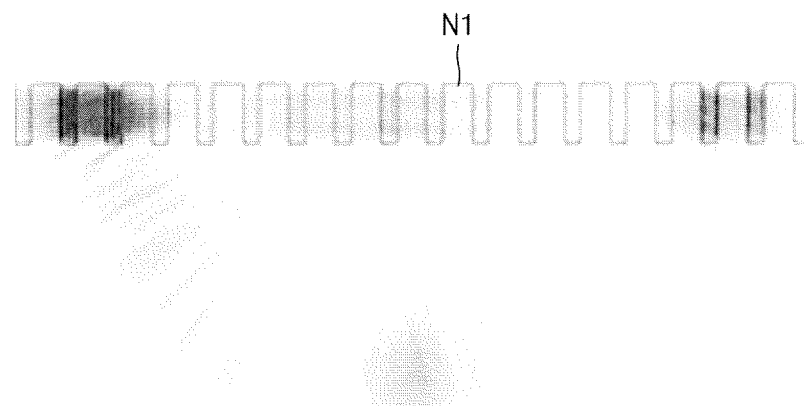
FIGS. 10A and 10B show simulation results of light scattering according to a comparative example and an example of the present application.
Figure 10B:
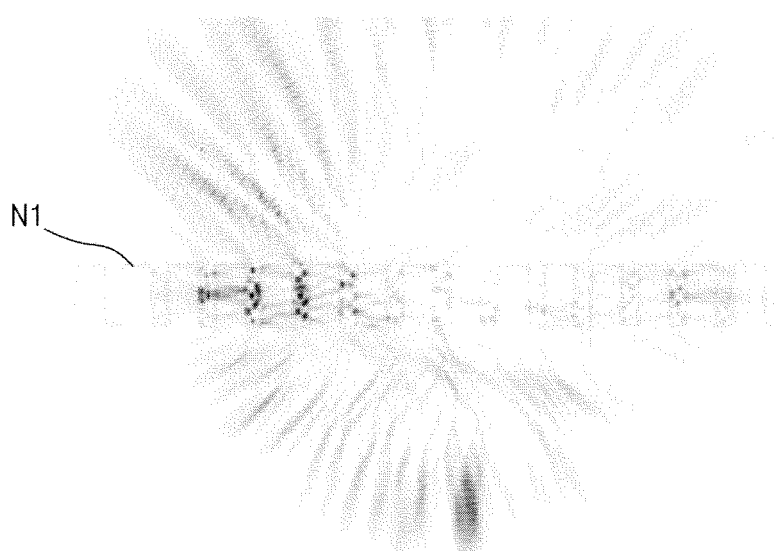

FIGS. 10A and 10B show simulation results of light scattering according to a comparative example and an example, respectively. FIG. 10A shows a case where light emitted in a lateral direction is scattered according to Comparative Example 1. FIG. 10B shows a case where light emitted in a lateral direction is scattered according to Example 2.

In Comparative Example 1, light L1 emitted between the vertical light-emitting structures N1 is barely scattered upward and downward, as shown in FIG. 10A. On the other hand, in Example 2, the light L1 emitted between the vertical light-emitting structures N1 is noticeably scattered, as shown in FIG. 10B.

As described above, according to the present example, the light L1 emitted in a lateral direction may be rapidly reflected upward or downward so as to minimize the amount of light absorbed by the light-absorbing member 60, thereby increasing a luminous efficiency of a 3D light-emitting device.

While the foregoing has described what are considered to be the best mode and/or other examples, it is understood that various modifications may be made therein and that the subject matter disclosed herein may be implemented in various fauns and examples, and that the teachings may be applied in numerous applications, only some of which have been described herein. It is intended by the following claims to claim any and all applications, modifications and variations that fall within the true scope of the present teachings.

What is claimed is:

1. A light-emitting device, comprising:
    a lower portion;
    a plurality of vertical light-emitting structures disposed on the lower portion;
    a conductive member partially surrounding the plurality of vertical light-emitting structures; and
    a plurality of reflective members disposed between the plurality of vertical light-emitting structures and configured to reflect light that is emitted in a lateral direction from the plurality of vertical light-emitting structures,
    wherein each of the plurality of reflective members comprises an internal portion and an external portion, the internal and external portions having different refractive indexes.

2. The light-emitting device of claim 1, wherein each of the plurality of vertical light-emitting structures has a core-shell structure.

3. The light-emitting device of claim 2, wherein:
    each of the plurality of vertical light-emitting structures comprises:
        a first conductive type semiconductor,
        an active layer, and
        a second conductive type semiconductor,
    the first conductive type semiconductor is a core portion, and
    the active layer and the second conductive type semiconductor are a shell portion.

4. The light-emitting device of claim 1, wherein each of the plurality of vertical light-emitting structures has any one shape selected from: nanorod, nanowire, or nanopyramid shape.

5. The light-emitting device of claim 1, wherein the conductive member comprises:
    any one of indium tin oxide (ITO), ZnO, IZO(ZnO:In), AZO(ZnO:Al), GZO(ZnO:Ga), $In_2O_3$, $SnO_2$, CdO, $CdSnO_4$, and $Ga_2O_3$.

6. The light-emitting device of claim 1, wherein a refractive index of each of the plurality of reflective members is smaller than a refractive index of the conductive member.

7. A light-emitting device, comprising:
    a lower portion;
    a plurality of vertical light-emitting structures disposed on the lower portion;
    a conductive member partially surrounding the plurality of vertical light-emitting structures; and
    a plurality of reflective members disposed between the plurality of vertical light-emitting structures and configured to reflect light that is emitted in a lateral direction from the plurality of vertical light-emitting structures,
    wherein the plurality of reflective members each has a nanobead shape.

8. The light-emitting device of claim 1, wherein a refractive index of the internal portion of each of the plurality of reflective members is smaller than a refractive index of the external portion.

9. The light-emitting device of claim 1, wherein the plurality of reflective members have the same diameter.

10. The light-emitting device of claim 1, wherein the plurality of reflective members have two or more diameters.

11. The light-emitting device of claim 1, further comprising:
    a mask layer disposed on the lower portion and having a plurality of holes that expose the lower portion therethrough,
    wherein the plurality of vertical light-emitting structures are disposed on regions of the lower portion, which are exposed by the plurality of holes.

12. The light-emitting device of claim 1, wherein the lower portion comprises:
    a substrate and a semiconductor layer disposed on the substrate, and
    wherein the plurality of vertical light-emitting structures are disposed on the semiconductor layer.

\* \* \* \* \*